(12) United States Patent
Szczech et al.

(10) Patent No.: US 10,820,083 B2
(45) Date of Patent: Oct. 27, 2020

(54) ACOUSTIC ASSEMBLY HAVING AN ACOUSTICALLY PERMEABLE MEMBRANE

(71) Applicant: KNOWLES ELECTRONICS, LLC, Itasca, IL (US)

(72) Inventors: John Szczech, Schaumburg, IL (US); Sandra Vos, East Dundee, IL (US); William Ryan, Itasca, IL (US); Yu Du, Itasca, IL (US); Jose Salazar, Itasca, IL (US); Charles King, Itasca, IL (US)

(73) Assignee: Knowles Electronics, LLC, Itasca, IL (US)

(*) Notice: Subject to any disclaimer, the term of this patent is extended or adjusted under 35 U.S.C. 154(b) by 0 days.

(21) Appl. No.: 16/393,563

(22) Filed: Apr. 24, 2019

(65) Prior Publication Data

US 2019/0335262 A1    Oct. 31, 2019

Related U.S. Application Data

(60) Provisional application No. 62/663,160, filed on Apr. 26, 2018.

(51) Int. Cl.

| | |
|---|---|
| H04R 1/08 | (2006.01) |
| B81B 7/00 | (2006.01) |
| B81C 1/00 | (2006.01) |
| H04R 1/04 | (2006.01) |
| H04R 19/00 | (2006.01) |

(Continued)

(52) U.S. Cl.
CPC .......... H04R 1/083 (2013.01); B81B 7/0038 (2013.01); B81C 1/00158 (2013.01); H04R 1/04 (2013.01); H04R 19/005 (2013.01); H04R 19/016 (2013.01); H04R 31/003 (2013.01); B81B 2201/0257 (2013.01); H04R 2201/003 (2013.01)

(58) Field of Classification Search
CPC .......... B81B 2201/0257; B81B 7/0038; B81C 1/00158; B81C 1/00182; H04R 19/005; H04R 19/016; H04R 1/023; H04R 19/04; H04R 1/04; H04R 1/44; H04R 1/083; H04R 1/086; H04R 2201/003; H04R 31/003; H04R 31/006; H04R 2499/11; H04M 1/18; H04B 2001/3894
See application file for complete search history.

(56) References Cited

U.S. PATENT DOCUMENTS

| | | |
|---|---|---|
| 7,190,038 B2 | 3/2007 | Dehe et al. |
| 7,473,572 B2 | 1/2009 | Dehe et al. |

(Continued)

FOREIGN PATENT DOCUMENTS

CN             204206444        3/2015

Primary Examiner — Kile O Blair
(74) Attorney, Agent, or Firm — Foley & Lardner LLP

(57) ABSTRACT

An acoustic device including a motor disposed in a housing having a non-porous elastomeric membrane disposed across an acoustic path defined by a sound port of the housing is disclosed. The motor may be embodied as MEMS transducer configured to generate an electrical signal responsive to an acoustic signal, or as some other electromechanical device. The membrane has a compliance that is 1 to 100 times a compliance of the acoustic device without the membrane, wherein the membrane prevents ingress of contaminants (e.g., solids, liquids or light) via the sound port while permitting propagation of the acoustic signal along the acoustic path without significant loss.

22 Claims, 9 Drawing Sheets

(51) Int. Cl.
    *H04R 19/01*     (2006.01)
    *H04R 31/00*     (2006.01)

(56) References Cited

U.S. PATENT DOCUMENTS

| | | |
|---|---|---|
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 8,532,323 B2 | 9/2013 | Wickstrom et al. |
| 8,798,304 B2 | 8/2014 | Miller et al. |
| 8,983,105 B2 | 3/2015 | Reining |
| 9,078,063 B2 | 7/2015 | Loeppert et al. |
| 9,078,064 B2 | 7/2015 | Wickstrom et al. |
| 9,451,349 B2 | 9/2016 | Wickstrom et al. |
| 10,167,188 B2 | 1/2019 | Agashe et al. |
| 2003/0085070 A1 | 5/2003 | Wickstrom |
| 2005/0207605 A1 | 9/2005 | Dehe et al. |
| 2007/0278501 A1 | 12/2007 | MacPherson et al. |
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2011/0255728 A1* | 10/2011 | Abe .................. H04M 1/03 381/355 |
| 2012/0093353 A1* | 4/2012 | Windischberger ....... H04R 1/22 381/396 |
| 2014/0294209 A1 | 10/2014 | Szczech et al. |
| 2016/0165334 A1 | 6/2016 | Grossman |
| 2020/0039816 A1* | 2/2020 | Zou .................. B81B 7/0061 |

\* cited by examiner

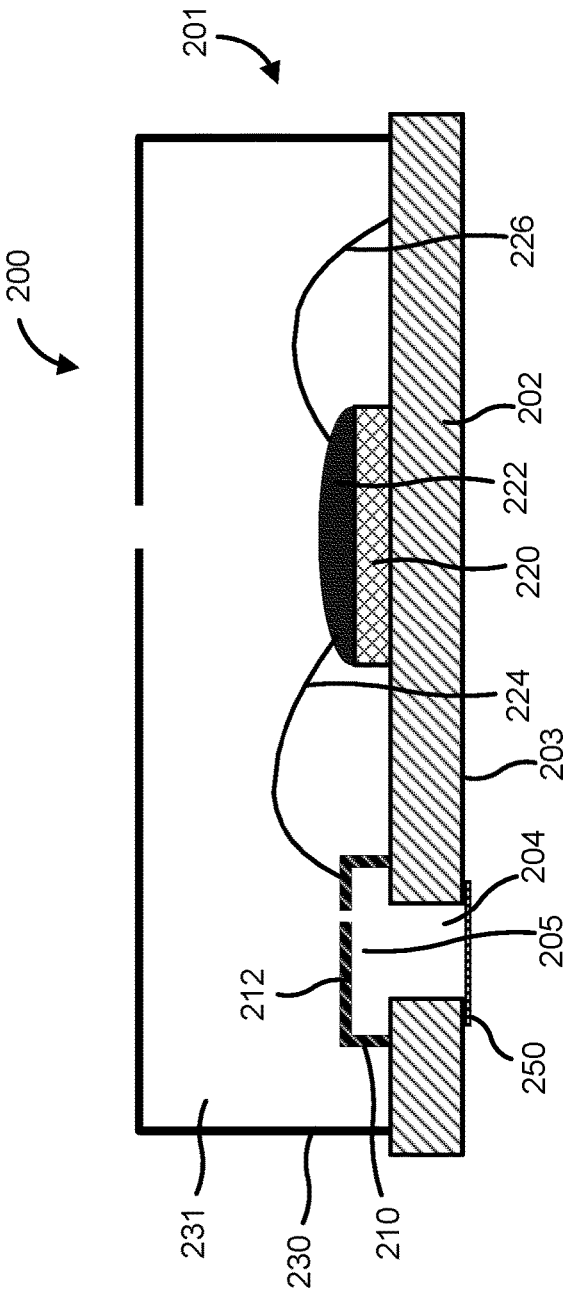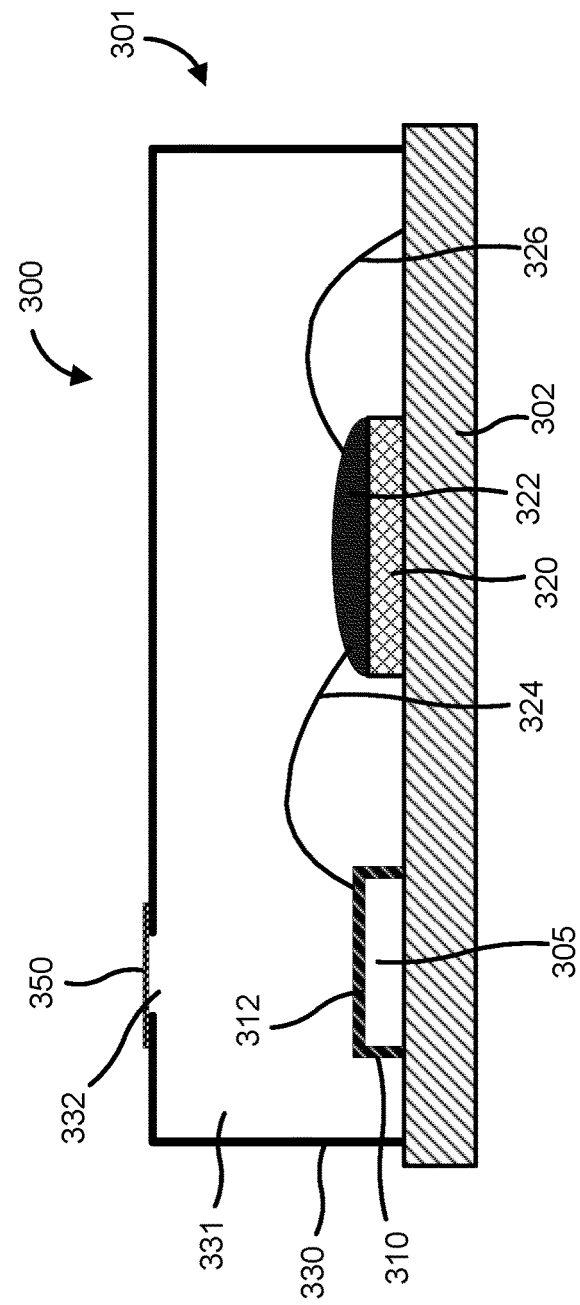
FIG. 2
FIG. 3

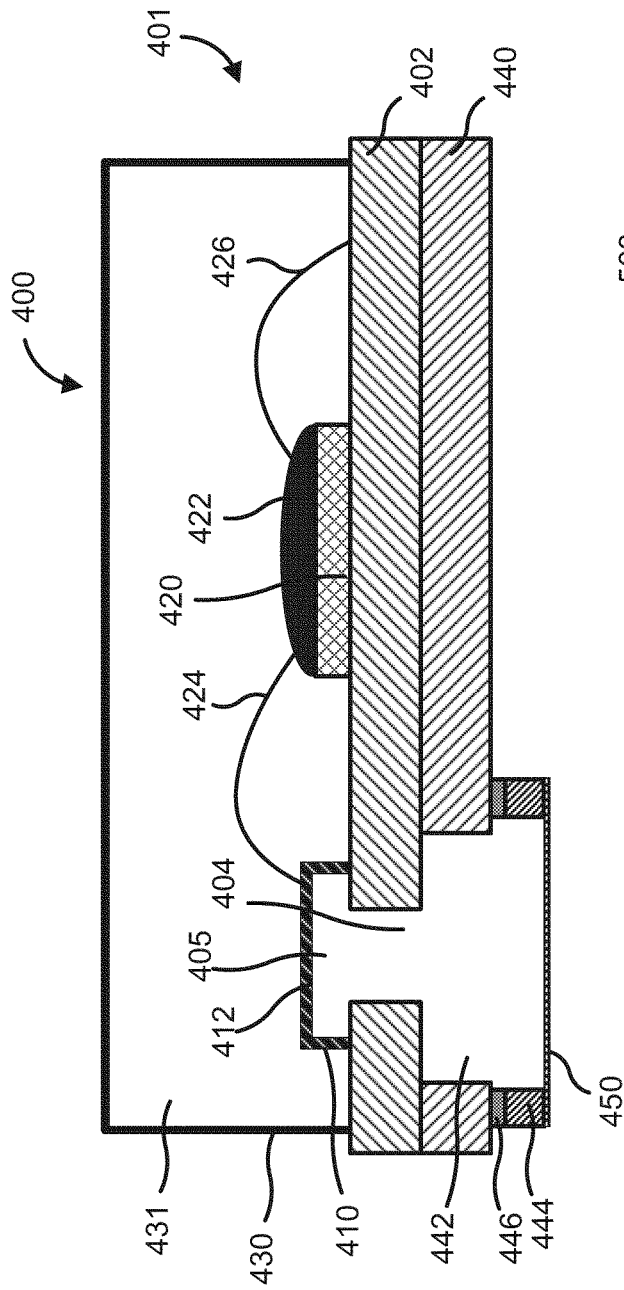

US 10,820,083 B2

ACOUSTIC ASSEMBLY HAVING AN ACOUSTICALLY PERMEABLE MEMBRANE

CROSS-REFERENCE TO RELATED APPLICATIONS

This application claims the benefit of and priority to U.S. Provisional Patent Application No. 62/663,160, filed Apr. 26, 2018, the entire contents of which are incorporated herein by reference.

TECHNICAL FIELD

The present disclosure relates generally to acoustic devices and more particularly to acoustic device and assemblies having reduced contaminant susceptibility without significant reduction in audio performance, and methods therefor.

BACKGROUND

Advancements in fabrication technologies have led to the development of progressively smaller acoustic devices including a motor disposed in a housing having one or more sound ports defining an acoustic passage between an interior of the housing and an exterior thereof. Such devices include microelectromechanical systems (MEMS) and electret microphone assemblies that convert acoustic energy to electrical signals. These and other acoustic devices are typically integrated with a host device, like a cell phone, slate, laptop computer, earphone, hearing device among a variety of the other devices, machines, vehicles and appliances as is known generally. However these and other acoustic devices are susceptible to contamination from particulates, liquids and possibly light. Depending on the type of acoustic device and the use case, such contaminants may cause obstruction, interference, and corrosion among other adverse effects that compromise performance or reduce longevity.

BRIEF DESCRIPTION OF DRAWINGS

The objects, features and advantages of the present disclosure will become more fully apparent to those of ordinary skill in the art upon consideration of the following Detailed Description and the appended claims in conjunction with the accompanying drawings.

FIG. 2 is a side cross-section view of a microphone assembly according to an embodiment.

FIG. 3 is a side cross-section view of a microphone assembly according to another embodiment.

FIG. 4 is a side cross-section view of a microphone assembly according to yet another embodiment.

FIG. 5 is a side cross-section view of a microphone assembly according to still another embodiment.

Figure 1:
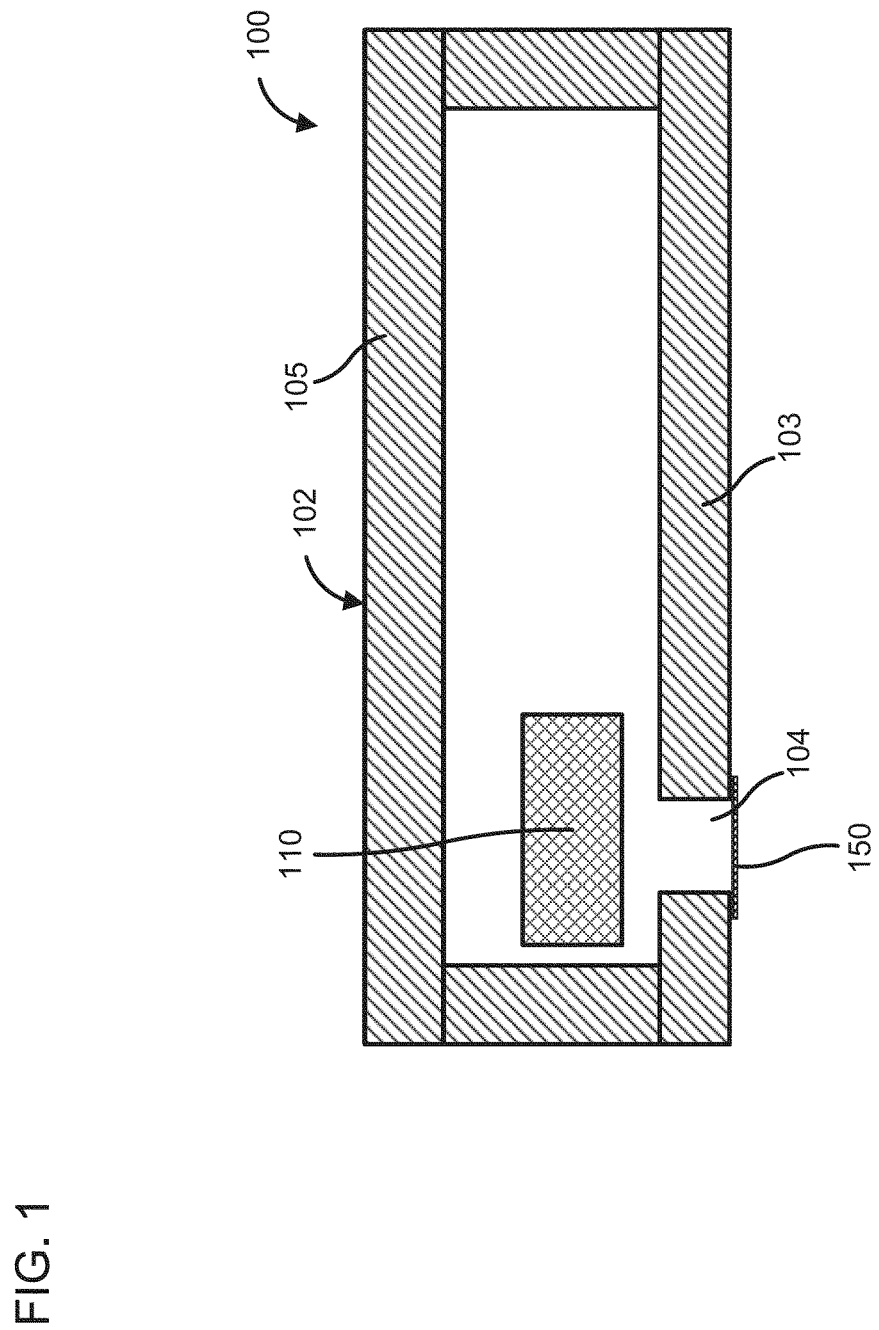
FIG. 1 is a schematic side cross-section view of a generic acoustic assembly.

In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure described herein and illustrated in the figures can be arranged, substituted, combined, and designed in a variety of different configurations, all of which are contemplated and made part of this disclosure.

DETAILED DESCRIPTION

The disclosure relates generally to an acoustic device having an elastomeric membrane that prevents or at least reduces ingress of contaminants without significantly obstructing the passage of sound through an acoustic passage defined partly by a sound port of the acoustic device. Such contaminants include one or more of solids, liquids or light. In some embodiments, the membrane equalizes pressure on opposite sides of the membrane either via a vent through the membrane or by diffusion of gas through the membrane. These and other aspects are described more fully herein.

FIG. 1 is a sectional view of an acoustic assembly 100 comprising a housing 102 defining an internal volume within which a motor 110 is disposed. In some embodiments, the housing includes a cover 105 coupled to a base 103. A sound port 104 extends through the housing and defines at least a portion of an acoustic path between the motor disposed in the internal volume of the housing and an exterior thereof. An elastomeric membrane 150 is disposed across the acoustic path wherein the membrane 150 at least partially prevents contamination by solids, liquids or light via the sound port while permitting the propagation of an acoustic signal along the acoustic path.

Generally, the elastomeric membrane is an acoustically transparent and non-porous material that is impermeable to contaminants while permitting propagation of an acoustic signal across the membrane without significant attenuation. Such membranes are impermeable to liquids and solids including sprays, mists, aqueous solutions, colloids, some solvents and vapors, fine dust, smoke, soot, debris, and other particulates. The membranes may also be impermeable to microbial contaminants. In other embodiments, the membrane has an electromagnetic shielding property that prevents or at least reduces ingress of light as discussed herein.

In one embodiment, the non-porous elastomeric membrane comprises a siloxane material. Siloxane materials include, for example, polysiloxanes such as polydimethylsiloxane (PDMS) among other polymers and elastomeric materials. Siloxane materials may have one or more of the following chemical structures: [—Si($CH_3$)RO—]; [—Si($CH_3$)XO—]; [—Si($C_6H_5$)RO—]; [—Si($CH_3$)$_2$($CH_2$)$_m$—]; [Si($CH_3$)$_2$($CH_2$)$_m$—Si($CH_3$)$_2$O—]; and [Si($CH_3$)$_2$($C_6H_4$)$_m$Si($CH_3$)$_2$O—], where R is typically an n-alkyl group and X is an n-propyl group made polar by substitution of atoms such as Cl or N. Siloxane materials include silicones, like VQM, PVQM, of which the siloxane functional group forms the so-called backbone. Such siloxane materials may also include additives including but not limited to $SiO_2$ filler, MQ-resin filler, transition metal oxide fillers (e.g., $TiO_2$) and calcite compounds as well as an adhesion promotor for hydrophilic surfaces.

Siloxane materials have high melting temperatures and are tolerant to temperatures to which some acoustic devices may be exposed during manufacture or integration with a host device. For example, some acoustic devices are integrated with a host device using solder or a conductive epoxy. Reflow soldering process temperatures typically exceed 200 degrees C. and conductive epoxy cure temperatures are typically about 150 degrees C. Thus in embodiments where the acoustic device is subject to high temperatures, the membrane is selected to have a melting point sufficient to withstand such temperatures. In one implementation, the membrane has a melting point that exceeds 140 degrees C. In another implementation the membrane has a melting point that exceeds 200 degrees C.

In some embodiments, the elastomeric membrane is bonded to a surface of the acoustic device using an adhesive between the membrane and the surface to which the membrane is bonded. However adhesives may increase cost or pose a contamination concern. In other embodiments, the elastomeric membrane is bonded to the acoustic device or assembly without using an adhesive. Siloxanes form a strong covalent bond with some materials. Such covalent bonds include for example Si—O—Si bonds. Thus in some implementations, a siloxane membrane is bonded covalently. A covalent bond may be formed by mating ionized surfaces of the membrane and the housing or other portion of the acoustic device to which the membrane will be bonded, mating the ionized parts, and applying heat to the mated parts. Surface ionization may be performed by exposing the mating surface to plasma or other ionizing energy source. Suitable ionization sources may depend on the type of material to be ionized. Plasmas with lighter ions like oxygen or nitrogen are suitable for ionizing thin membranes without damage whereas heavier plasma ions like argon may be use on the surface to which the membrane will be bonded. During ionization, the —O—Si(CH$_3$)$_2$— group of a siloxane membrane is converted to silanol group (—OH), which facilitates covalent bonding.

The acoustic assembly or portion thereof to which membrane bonding is desired may be formed from silicon, metal, plastic, FR4 or materials. Some materials that may be used in acoustic devices are not conducive to formation of a strong covalent bond. A reactive chemical group may be applied to the surface of such materials to ensure a strong covalent bond. In some embodiments, the siloxane membrane is bonded to a layer of uncured siloxane applied to the surface where membrane bonding is desired. The formation of covalent bonds between siloxanes and other materials is known generally and not described further herein.

In some embodiments, one or both bonding surfaces are preconditioned. Such preconditioning includes removal surface debris and contaminants with solvents, for example, acetone, methanol, ethanol, isopropyl alcohol, etc. One or both surfaces may also be roughened to improve bonding. Plasma treatment will also cleanse the bonding surfaces and may also be used to roughen the bonding surface.

Pressure equalization or relief is required in some acoustic devices to accommodate changes in pressure that may result from changes in atmospheric pressure and elevation changes and particularly rapid pressure changes that may occur in elevators aircraft, etc. Thus in some implementations, the membrane includes a pressure relief to equalize pressure on opposite sides of the membrane, for example between the internal volume of the housing and the exterior thereof. In some embodiments, the pressure relief is embodied as a small vent disposed through the membrane t. Siloxane membranes are generally gas permeable. Thus in other embodiments, pressure relief is associated with a gas diffusion property of the membrane. The diffusion rate depends generally on the area and thickness of the membrane among other factors. The diffusion rate of the membrane however may limit the ability of the membrane to accommodate some pressure gradients to which the acoustic device is exposed. Alternatively, the pressure relief may be provided by a portion of the acoustic device other than the membrane.

An elastomeric membrane disposed across the acoustic path of an acoustic device has potential to affect the performance of the device. In microphone assemblies, for example, the membrane may diminish the signal to noise ratio (SNR). SNR loss tends to increase with decreasing compliance and vice versa. The compliance of the membrane may be characterized relative to compliance of other parts of the acoustic device. The compliance of acoustic devices is a known characteristic and may be readily determined (e.g., empirically or by modeling) by those of ordinary skill in the art. For example, apart from the membrane, the compliance of a microphone assembly generally includes compliance associated with the internal volume of the housing and any compliance associated with the transducer (e.g., a condenser diaphragm), among other possible constituents depending on the type of device.

Generally, the elastomeric membrane has a compliance that is 1 to 100 times the compliance of the acoustic device without a membrane. These ranges are not intended to be limiting and the compliance of a particular membrane for a particular acoustic device will depend on the type, application requirements and performance specification among other factors associated with the acoustic device. For MEMS microphones having a capacitive transducer, preliminary modeling suggests that membrane compliance that is approximately equal to a compliance of the microphone assembly will yield an SNR loss of approximately 6 dB and that membrane compliance that is one order of magnitude (i.e., a factor of 10) greater than a compliance of the microphone assembly will yield an SNR loss less than 1 dB. Thus for applications where not more than approximately 6 dB SNR loss is acceptable, the membrane may have a compliance approximately the same as a compliance of the microphone assembly without the membrane. In applications where not more than approximately 1 dB SNR loss is required, the membrane may have a compliance that is one order of magnitude greater than a compliance of the microphone assembly without the membrane. SNR loss may be reduced further by providing a membrane with an even greater compliance. However, the relationship between membrane compliance and SNR loss is not necessarily linear.

A MEMS condenser microphone assembly without a membrane and having a footprint of 4 $mm^2$ to 11.5 $mm^2$ typically has a compliance of 1 nm/Pa to 10 nm/Pa and sound port diameter of a few mm. For the MEMS microphone assembly with an area of 4 $mm^2$ to 11.5 $mm^2$, the membrane may have a thickness in a range of 1-50 microns, a compliance of 1 nm/Pa to 1000 nm/Pa, and a diameter of 0.5 mm to 5 mm. The thickness of the elastomeric membrane depends generally on the compliance required for a particular application or use case, the dimensions of sound port, elasticity and pre-stress of the membrane among other factors, operating temperature. These ranges are not intended to be limiting and the compliance of a particular acoustic device or membrane will depend on the particular acoustic device and its performance specifications among other factors. For example, an electret microphone may have different ranges since the dimensions and compliance of electret microphones is generally different than the compliance of MEMS microphones.

In some acoustic devices, the housing includes a metal or other barrier that prevents ingress of electromagnetic radiation. Such radiation may be a source of noise and other performance degradation. However the sound port remains unprotected. Thus in some embodiments, the elastomeric membrane includes a radiation shielding property that prevents or at least reduces propagation of electromagnetic radiation into the internal volume of the housing via the sound port. Such radiation is typically includes light in the infrared, visible and ultraviolet frequency ranges, although it may not be necessary to filter all such frequencies in all embodiments. In one embodiment, the radiation shielding property can be attributed to a thin layer (e.g., of 1 nm to 100 nm) of electromagnetic shielding material (e.g., a light reflecting material, light absorbing pigment, aluminum or other metals) deposited on the membrane. Such a layer may be applied in a vapor deposition, screen printing or other thin-film process. Alternatively, the shielding material (e.g., carbon or metal nanoparticles) may be mixed with precursors that form the membrane such that the electromagnetic shielding material is incorporated in the structure of the membrane. Combinations of these approaches may be used as well.

FIGS. 2, 3, 4 and 5 are sectional views of acoustic devices embodied as a microphone assembly 200, 300, 400, 500 including an acoustic transducer 210, 310, 410, 510 and an electrical (e.g., integrated) circuit 220, 320, 420, 520 disposed within a housing 201, 301, 401, 501, respectively. The housing comprises a substrate or base 202, 302, 402, 502 and a cover 230, 330, 430, 530, respectively. The substrate can be formed from printed circuit board (PCB) material (e.g., FR4). As suggested, the base may include an electromagnetic shielding material. The cover may be formed from metal (e.g., aluminum, copper, stainless steel, etc.), FR4, plastics, polymers, etc., and is coupled to the substrate, for example, via an adhesive, fusion bonding, soldering or other fastening mechanism.

The acoustic device generally includes an external-device interface (i.e., an electrical interface) having a plurality of electrical contacts (e.g., power, ground data, clock) for electrical integration with a host device. The external device interface can be disposed on an outer surface of the base and configured for reflow soldering to a host device. Alternatively the interface can be disposed on some other surface of the housing. In FIGS. 2, 3, 4 and 5, the integrated circuit is electrically coupled to an electrical output of the acoustic transducer by one or more electrical leads 224, 324, 424, 524, respectively. FIGS. 2, 3, 4 and 5 also show the integrated circuit covered by an encapsulating material 222, 322, 422, 522, respectively, which may have electrical insulating, electromagnetic and thermal shielding properties. The integrated circuit receives an electrical signal from the transducer and may amplify or condition the signal before outputting a digital or analog acoustic signal. FIGS. 2, 3, 4 and 5 show one or more electrical leads 226, 326, 426, 526, respectively, electrically coupling the integrated circuit to an external-device interface. The electrical circuit may also include a protocol interface circuit, like PDM, PCM, Sound-Wire, I2C, I2S or SPI, among others, with corresponding contacts on the external-device interface.

In FIGS. 2, 4 and 5, a sound port 204, 404, 504, respectively, is formed in the substrate and at least partially defines an acoustic path between an internal volume of the housing and the exterior thereof. In FIG. 3, the sound port 332 is formed in the cover 330. Alternatively, the sound port may be disposed in a side wall of the acoustic device.

In one embodiment, the acoustic transducer 210 is a microelectromechanical systems (MEMS) transducer. In FIGS. 2, 4 and 5 the transducer 210, 410, 510 is a MEMS condenser transducer having a diaphragm 212, 312, 412, 512 that moves relative to a back plate in response to changes in air pressure. In these embodiments, the diaphragm separates the internal volume into a front volume 205, 305, 405, 505 and a back volume 231, 305, 431, 531, wherein the front volume is in fluidic communication with the acoustic path through the port. In other embodiments, the acoustic transducer is a non-MEMS device embodied, for example, as an electret transducer having a diaphragm that moves relative to a back plate. In still other embodiments, the MEMS transducer is a piezoelectric transducer or some other known or future electro-acoustic transduction device implemented using MEMS or other technology.

In FIGS. 2-5, the transducer is mounted on the base over the sound port. In FIG. 3, alternatively, the transducer 310 could be mounted on the cover over the port 332. The transducer could also be mounted on a side wall. Some MEMS transducers (e.g., capacitive transducers) include a bulk portion that forms a cavity adjacent the back plate or diaphragm. In FIGS. 2-5, the transducer cavity forms part of the front volume 205, 331, 405, 505 in acoustic communication with the acoustic path formed partly by the sound port. Non-MEMS electret condenser transducers are similarly situated relative to the sound port of the housing. Other types of transducers however may not necessarily be mounted directly over or adjacent the sound port.

In FIGS. 2 and 3 an elastomeric membrane 250, 350, respectively, is disposed on the housing and over the sound port thereof. In FIG. 2, the membrane is disposed on an outer surface 203 of the base 202. Alternative, the membrane 250 could be disposed on an inner surface of the base 202 within the internal volume of the housing. In FIG. 3, the membrane 350 is disposed on an outer surface 203 of the cover or lid 330. Alternatively the membrane 350 could be disposed on an inner surface of the lid 300 within the internal volume of the housing.

In some embodiments, a membrane is coupled to a portion of the host device with which the acoustic device is integrated instead of, or in addition to, coupling the membrane to the acoustic device. In FIG. 4, the acoustic device 400 is shown in combination with a substrate portion 440 that could be part of a host device circuit board, outer housing or other portion of a host device with which the acoustic device is integrated. Generally, the substrate 440 includes a port 442 aligned with the sound port 404 of the base 402 the combination of which at least partly form the acoustic path. In FIG. 4, the substrate 440 may include an electrical interface with contacts that are electrically coupled to contacts on the base 402 of the acoustic assembly as is known generally by those of ordinary skill. Where the sound port is located on the housing cover as shown in FIG. 3, the cover may be coupled to the substrate. In side-port acoustic devices, a side portion of the housing may be coupled to the substrate. Alternatively adhesives or other fastening means may be used to couple the acoustic device to the host as described herein.

In FIG. 4, the membrane may be coupled to the substrate by a covalent bond or an adhesive bond or other fastener. In some embodiments, the substrate 440 includes a discrete mounting structure 444 fastened to the substrate, for example by an adhesive 446, insert molding process or other means. The mounting surface has a diameter larger than a diameter of the sound port. The larger diameter mounting surface accommodates a larger diameter membrane, which has a relatively large compliance compared to a membrane with a smaller diameter. Alternatively, the mounting structure is formed integrally with the substrate. The mounting structure provides a protruding surface on which to fasten the membrane or it may be recessed. In some embodiments the mounting surface is formed of a material suitable (e.g., silicon, metal, PDMS, plastic etc.) for covalently bonding the membrane thereto in embodiments where the surface of the acoustic device in not otherwise suitable for covalent bonding. In FIG. 4, the membrane 450 is shown bonded to outer surface of the substrate 440. Alternatively, the membrane may be disposed in a recess between the base 402 and the substrate 440.

In FIG. 5, the membrane 550 is disposed across the acoustic path and fastened to the transducer 510, wherein the membrane prevents contamination of the transducer and other components disposed in the internal volume of the housing. As discussed, some MEMS transducers include a bulk portion that forms a cavity adjacent the back plate or diaphragm wherein the cavity forms part of the front volume. In this embodiment, the membrane is disposed across the acoustic path and at least partially over the cavity of the transducer. In FIG. 5, an optional spacer 542 is disposed between the transducer 510 and the base 502. The spacer may be embodied as a shim or ring shaped structure that is adhered or otherwise fastened to the base 502. The spacer may be formed of a material, like silicon, metal or a polymer, to which siloxane may be bonded covalently without using any adhesive.

Figure 6A:
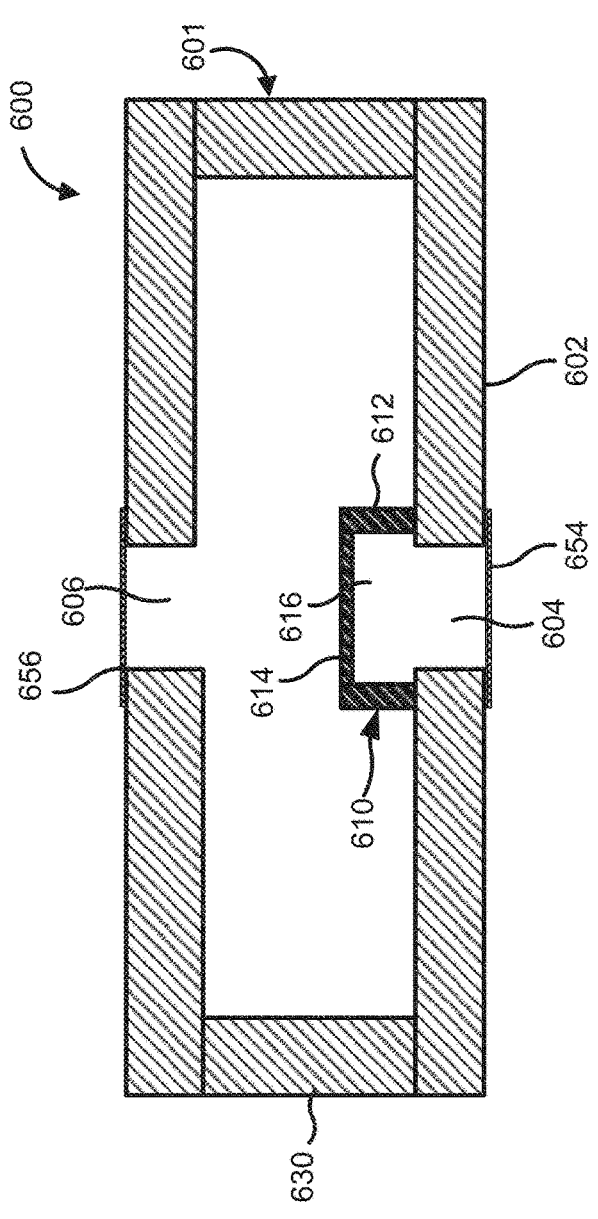
FIG. 6A is a side cross-section view of an acoustic valve assembly in a closed configuration and FIG. 6B shows the acoustic valve assembly of FIG. 6A in an open configuration.
Figure 6B:
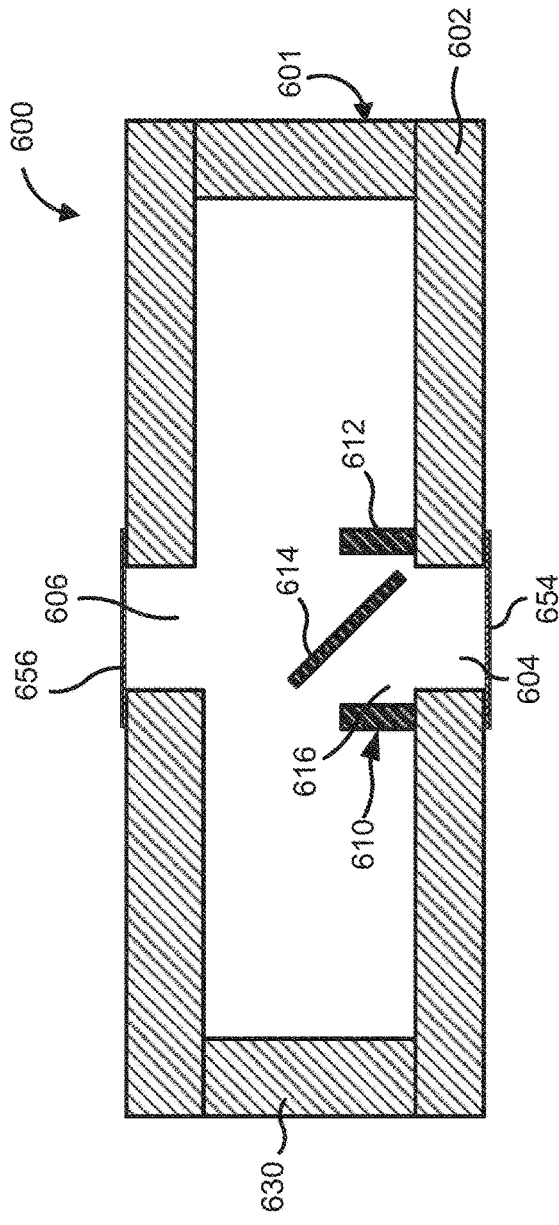

FIGS. 6A and 6B show an acoustic valve 600 comprising a housing having portions 602 and 630 defining an internal volume. The housing could have a polygonal or cylindrical section. The housing includes a first and second sound ports 604 and 606 defining portions of an acoustic passage through the valve. The acoustic valve also includes an electro-mechanical motor 610 that moves an armature 614 or other portion on and off of a valve seat to open and close the acoustic passage through the valve. FIG. 6A shows the valve closed and FIG. 6B shows the valve opened. Acoustic valves and applications therefor are known generally by those of ordinary skill in the art as described in U.S. Pat. No. 8,798,304 assigned to Knowles Electronics LLC. In FIGS. 6A and 6B, a membrane 654 is disposed across the acoustic path and over the sound port 604 and another membrane 656 is disposed across the acoustic path and over the sound port 606. In some applications, a membrane may not be required over both sound ports. The membranes may be disposed on the outer surface of the housing as shown or located on an inner surface of the housing. The one or more membranes may be covalently bonded to the housing as described herein. Alternatively, the membranes may be coupled to the housing with an adhesive or with another fastener. In other embodiments, the one or more membranes are retained between parts of the valve forming a stacked assembly without the need for adhesive or covalent bonding.

Figure 7:
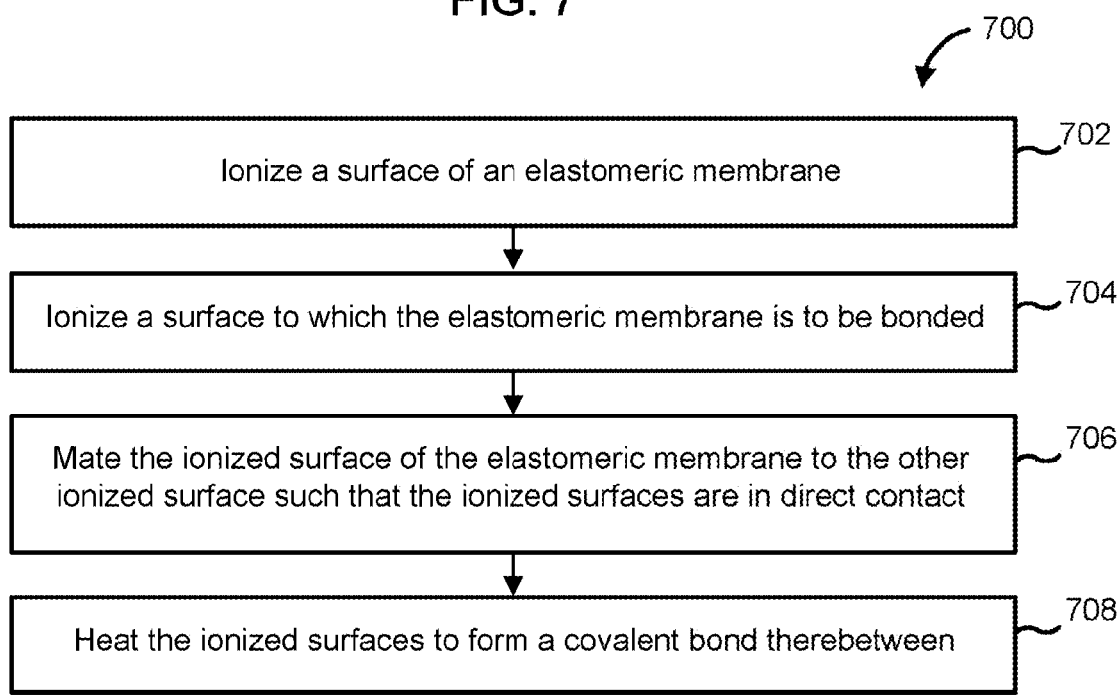
FIG. 7 is a schematic flow diagram of a method for making an acoustic device having a membrane.

FIG. 7 is a schematic process flow diagram for covalently bonding a non-porous elastomeric membrane to the housing or transducer of an acoustic device. At block 710, a surface of the membrane is ionized. At block 720, a surface to which the membrane will be bonded is ionized. Such surface could be the housing of the acoustic device, the transducer within the housing, or a portion of the host device. The ionization process may be performed using plasma, for example, 02 plasma or other ionizing energy source. At block 730, the ionized surfaces are mated wherein direct contact is made between the ionized surfaces. At block 740, heat is applied to the mated surfaces to cure or otherwise perfect the covalent bond.

The following section describes examples of acoustic performance of a MEMS microphone assembly with and without a membrane according to the embodiments described herein. It should be understood that these examples are only for illustrative purposes and are not meant to limit the scope of the concepts described herein.

Figure 8A:
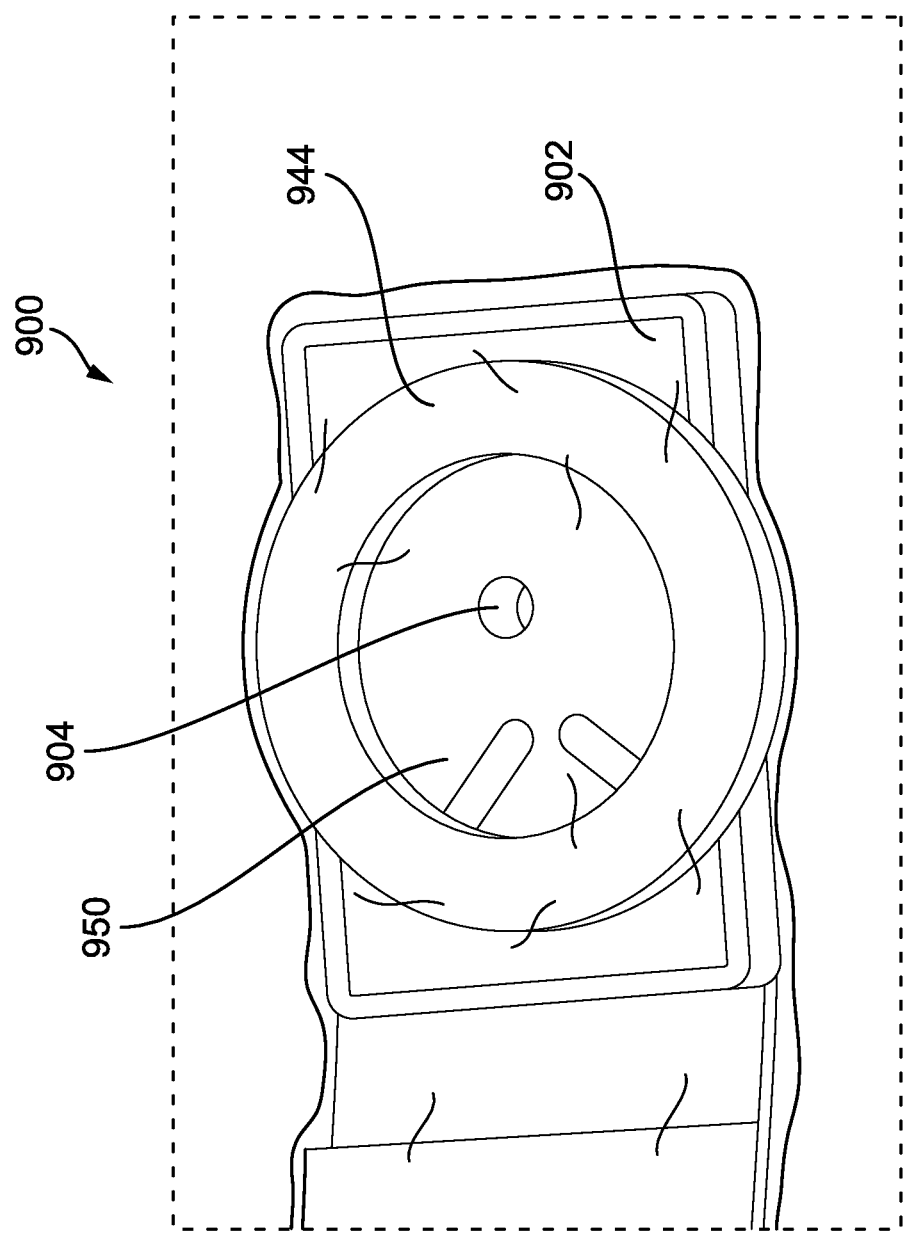
FIG. 8A is a bottom view of a microphone assembly having a membrane disposed on a port thereof.

FIG. 8A shows a bottom view of an example MEMS microphone assembly 900. The microphone assembly 900 includes a housing having a substrate 902 and a cover (not shown) disposed on the substrate 902. A sound port 904 is defined in the substrate 902 and is configured to allow acoustic signals to enter an internal volume defined by the housing. An acoustic transducer (not shown) is positioned within the internal volume and disposed on the substrate 902. A mounting structure 944 including a stainless steel ring is disposed on an outer surface of the substrate 902 around the port 904, and coupled thereto via an adhesive. A PDMS membrane is covalently bonded to the mounting structure without adhesive and has a diameter approximately 3 times a diameter of a diaphragm of the MEMS transducer.

Figure 8B:
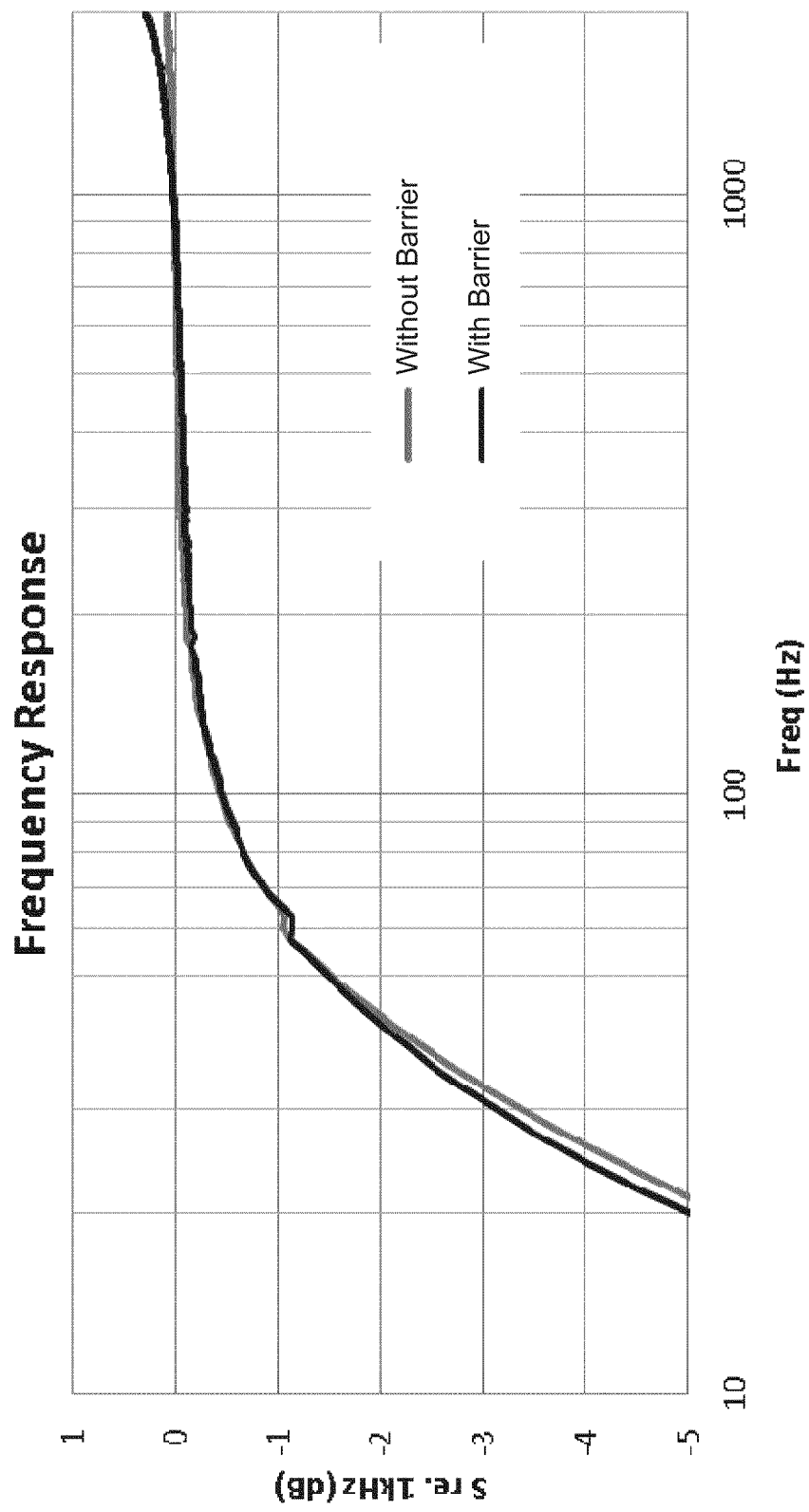
FIG. 8B is plot of acoustic response of the microphone assembly of FIG. 8A with and without a membrane disposed on the port thereof at various frequencies.
Figure 8C:
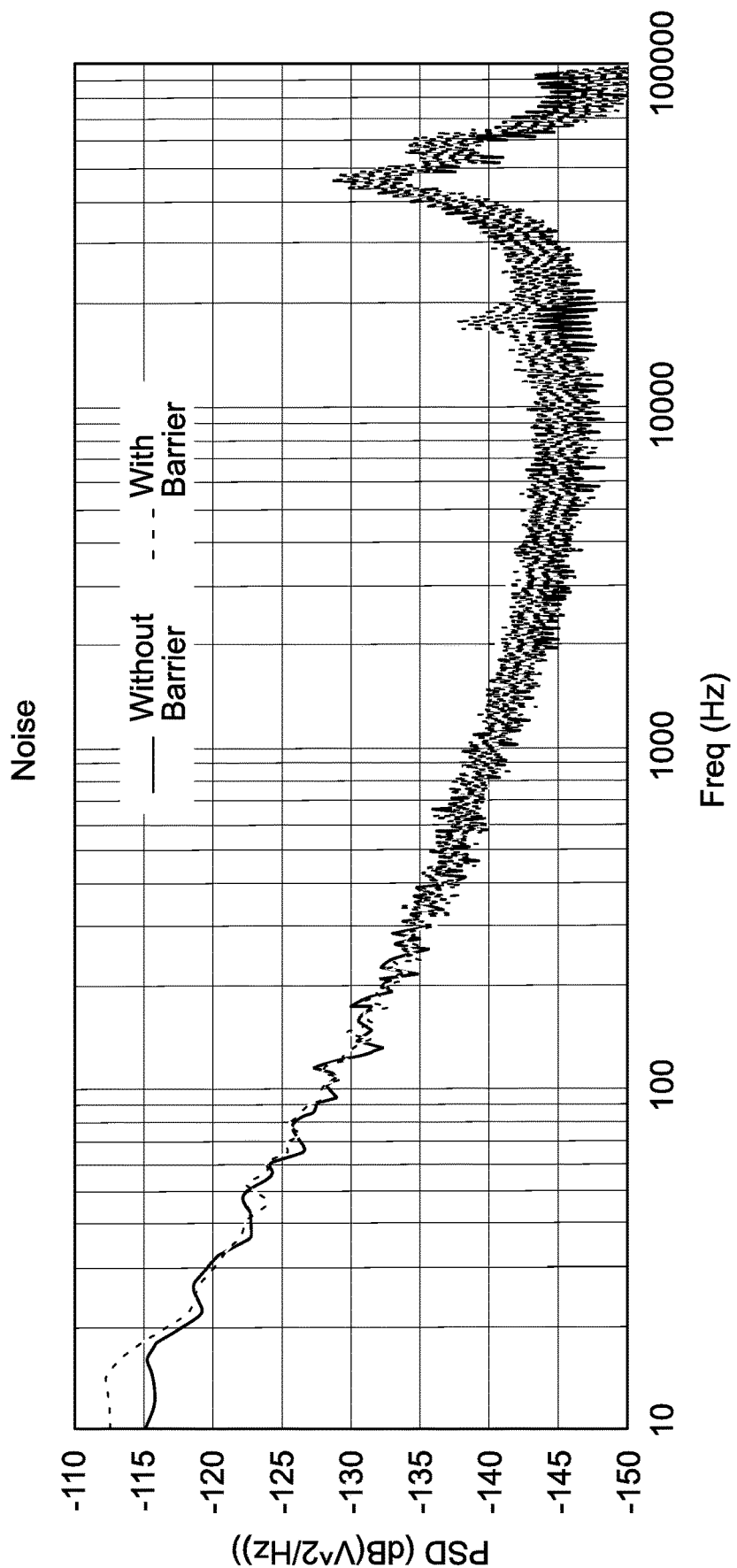
FIG. 8C is a plot of power spectral density (PSD) representing noise of the microphone assembly of FIG. 8A with and without a membrane disposed on the port thereof at various frequencies.
Figure 8D:
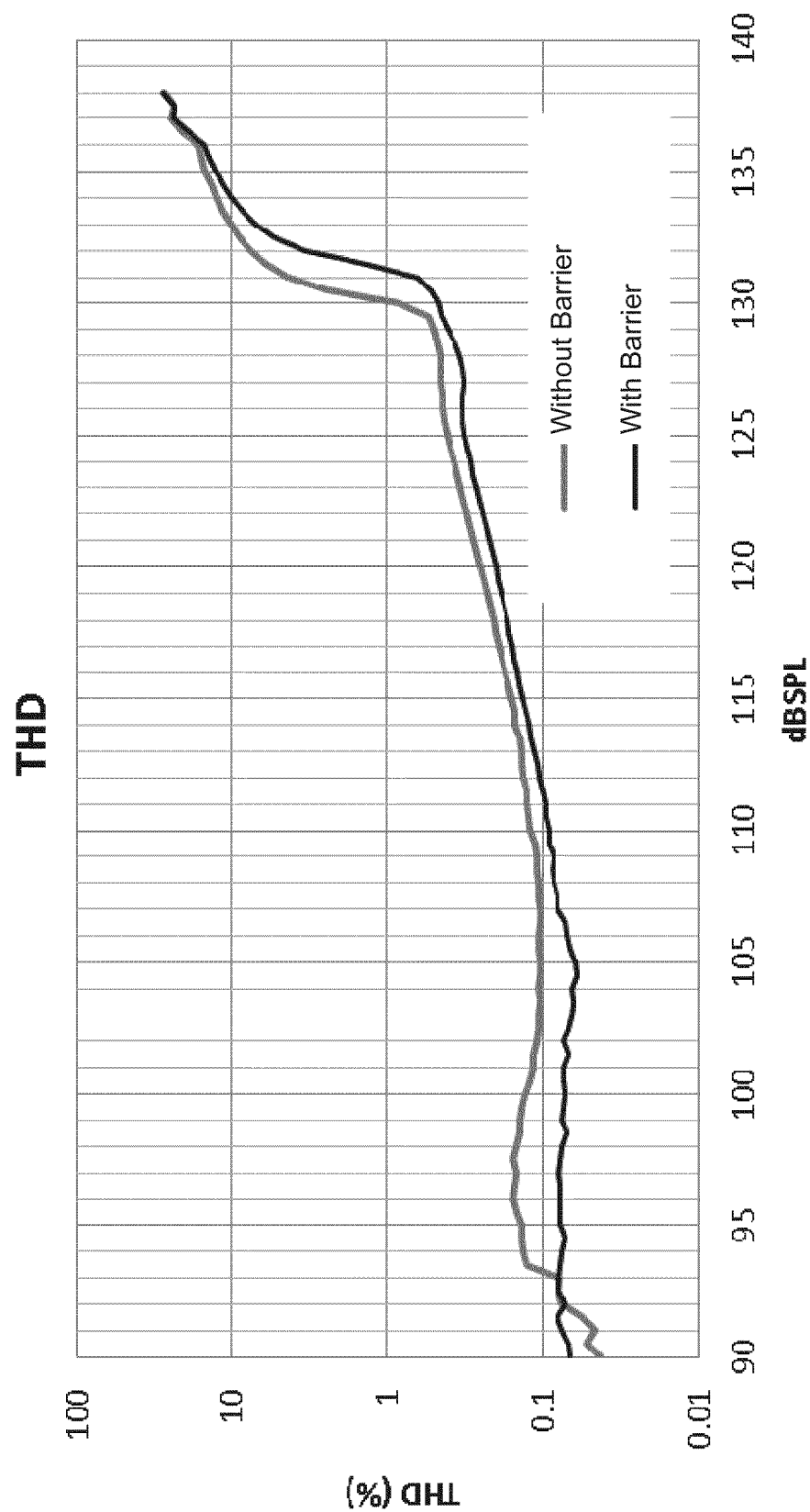
FIG. 8D is a plot of total harmonic distortion (THD) of the microphone assembly of FIG. 8A with and without a membrane disposed on the port thereof at various sound pressure levels (SPL).

FIG. 8B are plots of acoustic response vs frequency, FIG. 8C are plots of PSD vs frequency, and FIG. 8D are plots of THD vs SPL of the microphone assembly 900 in FIG. 8A without the membrane, and with the membrane disposed on the port thereof. As observed from FIGS. 8B-8D, the acoustic performance of the microphone assembly 900 with the membrane is substantially similar to the acoustic performance of the microphone assembly 900 without the membrane. This demonstrates that the membrane is substantially acoustically permeable so as to have negligible impact on the acoustic performance of the microphone assembly while preventing particulate liquids and solids from entering the microphone assembly. Table 1 summarizes the sound and noise levels of the microphone assembly with and without the membrane and the associated SNR.

TABLE 1

Sound level, noise level and SNR of the microphone assembly 900 with and without a membrane.

| Microphone Assembly | Sound Level (dBV) | Noise Level (dBV-A) | SNR (dBA) |
|---|---|---|---|
| Without Membrane | −38.0 | −102.7 | 64.7 |
| With Membrane | −38.1 | −102.3 | 64.2 |

As seen from Table 1, the membrane causes less than 1% reduction in the SNR of the microphone assembly.

In some embodiments, a microphone assembly comprises a microelectromechanical systems (MEMS) transducer disposed in a housing and configured to generate an electrical signal responsive to an acoustic signal. A sound port is disposed through the housing and defines at least a portion of an acoustic path between an exterior of the housing and the transducer. An integrated circuit is disposed in the housing and electrically coupled to an electrical output of the transducer. A non-porous elastomeric membrane is disposed across the acoustic path, the membrane having a compliance that is at least an order magnitude greater than a compliance of the microphone assembly wherein the membrane prevents solid or liquid contamination of the transducer via the sound port while permitting propagation of the acoustic signal along the acoustic path.

In some embodiments, an acoustic assembly includes a motor disposed in a housing having a sound port defining at least a portion of an acoustic path between an internal volume of the housing and an exterior thereof. An elastomeric membrane is disposed across the acoustic path and the membrane is covalently bonded to either the housing or the motor. The membrane prevents solid or liquid contamination of the assembly via the sound port and permits propagation of an acoustic signal along the acoustic path.

In some embodiments, a microphone assembly comprises a MEMS transducer disposed in a housing and configured to generate an electrical signal responsive to an acoustic signal. A sound port is disposed through the housing, defining at least a portion of an acoustic path between an interior of the housing and an exterior thereof. An integrated circuit is disposed in the housing and electrically coupled to an electrical output of the transducer. An electrical interface on a base of the housing includes contacts electrically coupled to the integrated circuit. A non-porous elastomeric membrane is covalently bonded to the either the housing or the transducer and disposed across the acoustic path, wherein the membrane has a compliance that is at least an order magnitude greater than a compliance of the microphone assembly. The membrane prevents solid or liquid contamination of the transducer via the sound port while permitting propagation of the acoustic signal along the acoustic path.

In yet another embodiment, a microphone assembly comprises a microelectromechanical systems (MEMS) transducer disposed in a housing and configured to generate an electrical signal responsive to an acoustic signal. A sound port is disposed through the housing and defines at least a portion of an acoustic path between an interior of the housing and an exterior thereof. An integrated circuit is disposed in the housing and electrically coupled to an electrical output of the transducer. An electrical interface on a base of the housing includes contacts electrically coupled to the integrated circuit. An elastomeric membrane is disposed across the acoustic path and is coupled to the housing. In one embodiment, the membrane has a compliance that is at least as great as a compliance of the microphone assembly without the membrane. In another embodiment, the membrane has a compliance at least one order magnitude greater than a compliance of the microphone assembly without the membrane. The membrane includes a light shielding property that at least partially obstructs ingress of light into the interior of the housing volume via the sound port while permitting propagation of the acoustic signal along the acoustic path. In one implementation, the membrane is covalently bonded to either the housing over the sound port or to the MEMS transducer. In another embodiment, the membrane has a melting point greater than 140 degrees C.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone assembly comprising:
   a housing including a cover coupled to a base;
   a microelectromechanical systems (MEMS) transducer disposed in the housing and configured to generate an electrical signal responsive to an acoustic signal;
   a sound port disposed through the housing, the sound port defining at least a portion of an acoustic path between an exterior of the housing and the transducer;
   an integrated circuit disposed in the housing and electrically coupled to an electrical output of the transducer; and
   an elastomeric membrane disposed across the acoustic path, the membrane having a compliance that is at least an order magnitude greater than a compliance of the microphone assembly,
   wherein:
     the membrane is formed from siloxane, and
     the membrane prevents solid or liquid contamination of the transducer via the sound port while permitting propagation of the acoustic signal along the acoustic path and diffusion of gases through the membrane.

2. The microphone assembly of claim 1, wherein the transducer includes a back plate and a diaphragm separating an internal volume of the housing into a front volume and a back volume, and the compliance of the microphone assembly is based on a stiffness of the diaphragm and a volume of the housing.

3. The microphone assembly of claim 1, wherein the melting point of the membrane is greater than 150 degrees C.

4. The microphone assembly of claim 1, wherein the membrane is bonded to the housing and over the sound port.

5. The microphone assembly of claim 4, wherein the sound port is disposed through the base or the cover, and the membrane is covalently bonded to a surface of the housing and over the sound port without an adhesive.

6. The microphone assembly of claim 1, wherein the membrane is covalently bonded to either the transducer or the housing.

7. The microphone assembly of claim 6, wherein the membrane has an electromagnetic shielding property that at least partially obstructs propagation of electromagnetic radiation into the internal volume of the housing.

8. The microphone assembly of claim 1 in combination with a substrate, wherein the base is coupled to the substrate, the acoustic path extends through the substrate, and the membrane is coupled to the substrate.

9. The microphone assembly of claim 1, wherein the membrane includes a pressure relief configured to equalize pressure between an internal volume of the housing and the exterior thereof.

10. The microphone assembly of claim 1, further comprising an electrical interface on the base, the electrical interface including electrical contacts electrically coupled to the integrated circuit.

11. An acoustic assembly comprising:
    a housing having an internal volume;
    a motor disposed within the internal volume of the housing;
    a sound port disposed through the housing, the sound port defining at least
    a portion of an acoustic path between the internal volume and an exterior of the housing; and
    an elastomeric membrane disposed across the acoustic path, the membrane covalently bonded to at least one of the housing or the motor, wherein:
the membrane is formed from siloxane, and,
the membrane prevents solid or liquid contamination of the assembly via the sound port and permits propagation of an acoustic signal along the acoustic path and diffusion of gases through the membrane.

12. The acoustic assembly of claim 11, wherein the membrane has a compliance that is at least an order of magnitude greater than a compliance of an acoustic sensor coupled to the assembly.

13. The acoustic assembly of claim 12, wherein the membrane comprises a siloxane material having a melting point greater than 140 degrees C.

14. The acoustic assembly of claim 12, the membrane includes a light shielding property, wherein propagation of light into the internal volume of the housing is at least partially obstructed by the membrane.

15. The acoustic assembly of claim 11 is a microphone assembly further comprising an electrical circuit, wherein the motor is an electro-acoustic transducer having an electrical output coupled to the electrical circuit and configured to generate an electrical signal in response to an acoustic signal propagated along the acoustic path, the membrane has a compliance that is between 1 and 10 times a compliance of the microphone assembly.

16. The acoustic assembly of claim 15, wherein the housing includes a cover, a base and an electrical interface on the base, the electrical interface including electrical contacts electrically coupled to the electrical circuit.

17. The acoustic assembly of claim 16, wherein the electro-acoustic transducer includes a back plate and a diaphragm, and wherein the compliance of the microphone assembly includes compliance of the diaphragm and the internal volume.

18. The acoustic assembly of claim 17, wherein the membrane is covalently bonded to the housing without an adhesive and the membrane is disposed over the sound port.

19. A microphone assembly comprising:
a housing including a cover coupled to a base;
a microelectromechanical systems (MEMS) transducer disposed in the housing and configured to generate an electrical signal responsive to an acoustic signal;
a sound port disposed through the housing, the sound port defining at least a portion of an acoustic path between an interior of the housing and an exterior thereof;
an integrated circuit disposed in the housing and electrically coupled to an electrical output of the transducer;
an electrical interface on the base, the electrical interface including electrical contacts electrically coupled to the integrated circuit; and
an elastomeric membrane covalently bonded to either the housing or the transducer and disposed across the acoustic path, the membrane having a compliance that is at least an order magnitude greater than a compliance of the microphone assembly,
wherein:
the membrane is formed from siloxane, and
the membrane prevents solid or liquid contamination of the transducer via the sound port while permitting propagation of the acoustic signal along the acoustic path and diffusion of gases through the membrane.

20. The microphone assembly of claim 19, wherein the membrane has an electromagnetic radiation shielding component that at least partially obstructs propagation of electromagnetic radiation into the interior of the housing.

21. A microphone assembly comprising:
a housing including a cover coupled to a base;
a microelectromechanical systems (MEMS) transducer disposed in the housing and configured to generate an electrical signal responsive to an acoustic signal;
a sound port disposed through the housing, the sound port defining at least a portion of an acoustic path between an interior of the housing and an exterior thereof;
an integrated circuit disposed in the housing and electrically coupled to an electrical output of the transducer;
an electrical interface on the base, the electrical interface including electrical contacts electrically coupled to the integrated circuit; and
an elastomeric membrane disposed across the acoustic path and coupled to the housing, the membrane having a compliance that is at least as great as a compliance of the microphone assembly,
the membrane includes a light shielding property that at least partially obstructs propagation of light into the internal volume of the housing volume via the sound port while permitting propagation of the acoustic signal along the acoustic path.

22. The microphone assembly of claim 21, wherein the membrane is covalently bonded to either the housing over the sound port or to the MEMS transducer, and the membrane has a melting point greater than 140 degrees C.

* * * * *